(12) United States Patent
Chen et al.

(10) Patent No.: US 8,304,688 B2
(45) Date of Patent: Nov. 6, 2012

(54) APPARATUSES FOR FABRICATING MICRO PATTERNS USING LASER DIODE ARRAY AND METHODS FOR FABRICATING MICRO PATTERNS

(75) Inventors: Ying-Chi Chen, Hsinchu County (TW); Rung-Ywan Tsai, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 499 days.

(21) Appl. No.: 12/617,679

(22) Filed: Nov. 12, 2009

(65) Prior Publication Data
US 2010/0272144 A1 Oct. 28, 2010

Related U.S. Application Data

(60) Provisional application No. 61/173,578, filed on Apr. 28, 2009.

(30) Foreign Application Priority Data

Aug. 31, 2009 (TW) .............................. 98129223 A

(51) Int. Cl.
*B23K 26/02* (2006.01)
(52) U.S. Cl. ......... 219/121.63; 219/121.78; 219/121.79; 219/121.82

(58) Field of Classification Search .......... 219/121.63–121.66, 121.78, 121.82, 219/121.85, 121.79
See application file for complete search history.

(56) References Cited

U.S. PATENT DOCUMENTS
6,498,679 B2 12/2002 Lee et al.
2001/0040730 A1 11/2001 Lee et al.

FOREIGN PATENT DOCUMENTS
JP 5-24374 2/1993
JP 2004-351440 12/2004

OTHER PUBLICATIONS

China Patent Office, Office Action, Patent Application Serial No. 200910170556.4, Dec. 7, 2011, China.

*Primary Examiner* — Minh-Loan T Tran

(57) ABSTRACT

Apparatuses for fabricating micro patterns using a laser diode array and methods for fabricating micro patterns are presented. The apparatus includes a laser diode array having at least one laser diode wherein light emitted from each laser diode is focused by a convex lens onto a second material layer attached to a first material layer. At least one driving shaft drives motion of the first and the second material layers. An adjustment means is used for adjusting the gap and pitch between adjacent laser diodes.

25 Claims, 8 Drawing Sheets

APPARATUSES FOR FABRICATING MICRO PATTERNS USING LASER DIODE ARRAY AND METHODS FOR FABRICATING MICRO PATTERNS

CROSS REFERENCE TO RELATED APPLICATIONS

This application is based upon and claims the benefit of priority from a prior U.S. Provisional Application No. 61/173,578, filed on Apr. 28, 2009, the entire contents of which are incorporated herein by reference.

This application is based upon and claims the benefit of priority from a prior Taiwanese Patent Application No. 098129223, filed on Aug. 31, 2009, the entire contents of which are incorporated herein by reference.

TECHNICAL FIELD

The invention relates to laser diode array fabrication apparatuses, and in particular, to apparatuses for fabricating micro patterns using a laser diode array and methods for fabricating micro patterns.

DESCRIPTION OF THE RELATED ART

Fabrication of large-sized and flexible display panels use conventional processes such as lithography, laser processing, inkjet printing, and thermal print-heat patterning, for mass production.

Conventional lithography is beneficial due to the fact that it's well-developed. However, a fabrication method using the lithography process is complicated and expensive. Meanwhile, $CO_2$ laser processing is advantageous due to the fact that it can be practically used. A pattern is created by several laser-scanning lines such that fine traces are left between the laser-scanning lines. However, production throughput is very slow. Additionally, controlling quality is difficult due to unstable laser sources. As for inkjet printing, inkjet printing is beneficial due to low production costs. Inkjet droplets, however, are difficult to apply on some materials. Additionally, quality of patterns may be insufficient due to volatile inkjet droplets and crooked ink trajectories.

The micro phase retardation plate of a conventional phase retarder structure includes two regions with different phase differences. Alternative regions with different phase retardation can be formed by a $CO_2$ laser heating treatment. U.S. Pat. No. 6,498,679, the entirety of which is hereby incorporated by reference, discloses a fabrication method for patterning phase retardation using a $CO_2$ laser heating. Patterns with different phase retardation characteristics are formed by laser scanning line by line. Several laser-scanning lines are composed on a patterned region.

SUMMARY

According to one embodiment, an apparatus for fabricating micro patterns using a laser diode array, comprising a laser diode array having at least one laser diode, wherein light emitted from each laser diode is focused by a convex lens onto a second material layer attached to a first material layer.

According to another embodiment, an apparatus for fabricating micro patterns using a laser diode array, comprising: a laser diode array having at least one laser diode, wherein light emitted from each laser diode is focused by a convex lens onto a second material layer attached to a first material layer; at least one driving shaft driving relative motion of the first and the second material layers; and an adjustment means for adjusting the gap and pitch between adjacent laser diodes.

According to another embodiment, a method for fabricating micro patterns, comprising: providing a laser diode array fabrication apparatus, wherein the laser diode array has at least one laser diode; and focusing a light emitted from each laser diode through a lens onto a second material layer which is disposed on the first material layer to create micro patterns on the first material layer.

BRIEF DESCRIPTION OF THE DRAWINGS

The invention can be more fully understood by reading the subsequent detailed description and examples with references made to the accompanying drawings, wherein.

DETAILED DESCRIPTION

Figure 1:
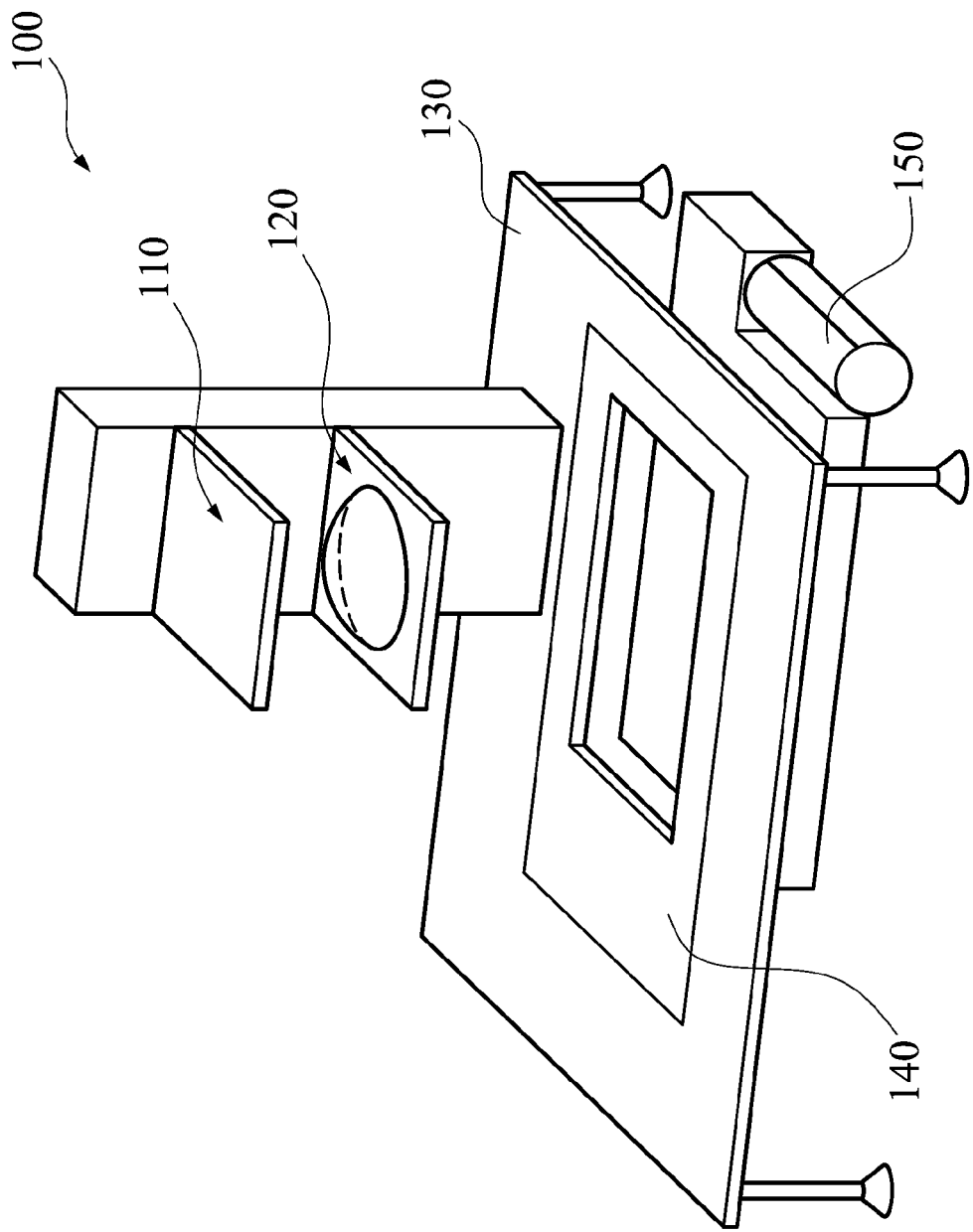
FIG. 1 is a schematic view of an embodiment of an apparatus for fabricating micro patterns using a laser diode array of the invention of the invention.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation method for a first feature over or onto a second feature in the description that follows may include embodiments in which the first and second features are formed in direct contact or not in direct contact.

Some embodiments provide an apparatus for fabricating micro patterns using a laser diode array of the invention. Specifically, a laser diode array can be applied to fabrication of micro patterns due to its small volume and low production cost.

FIG. 1 is a schematic view of an embodiment of an apparatus for fabricating micro patterns using a laser diode array. Referring to FIG. 1, an apparatus 100 for fabricating micro patterns using a laser diode array includes a laser diode array 110 having at least one laser diode, wherein the light emitted from each laser diode is focused by a convex lens 120 onto a second material layer attached to a first material layer. According to an embodiment, a single laser diode or a multiple of laser diodes is set up to a support frame and is fixed to a base stage 130. A working piece 140 such as a desired patterned flexible plate includes a second material layer disposed on a first material layer. The working piece 140 is disposed on the base stage 130 or a control platform. A precision bearings motor 150 is adopted to precisely control a driving shaft and driving movement of the first and second material layers. In one embodiment, the driving shaft is used to regulate moving speed of the first and second material layers.

Figure 2A:
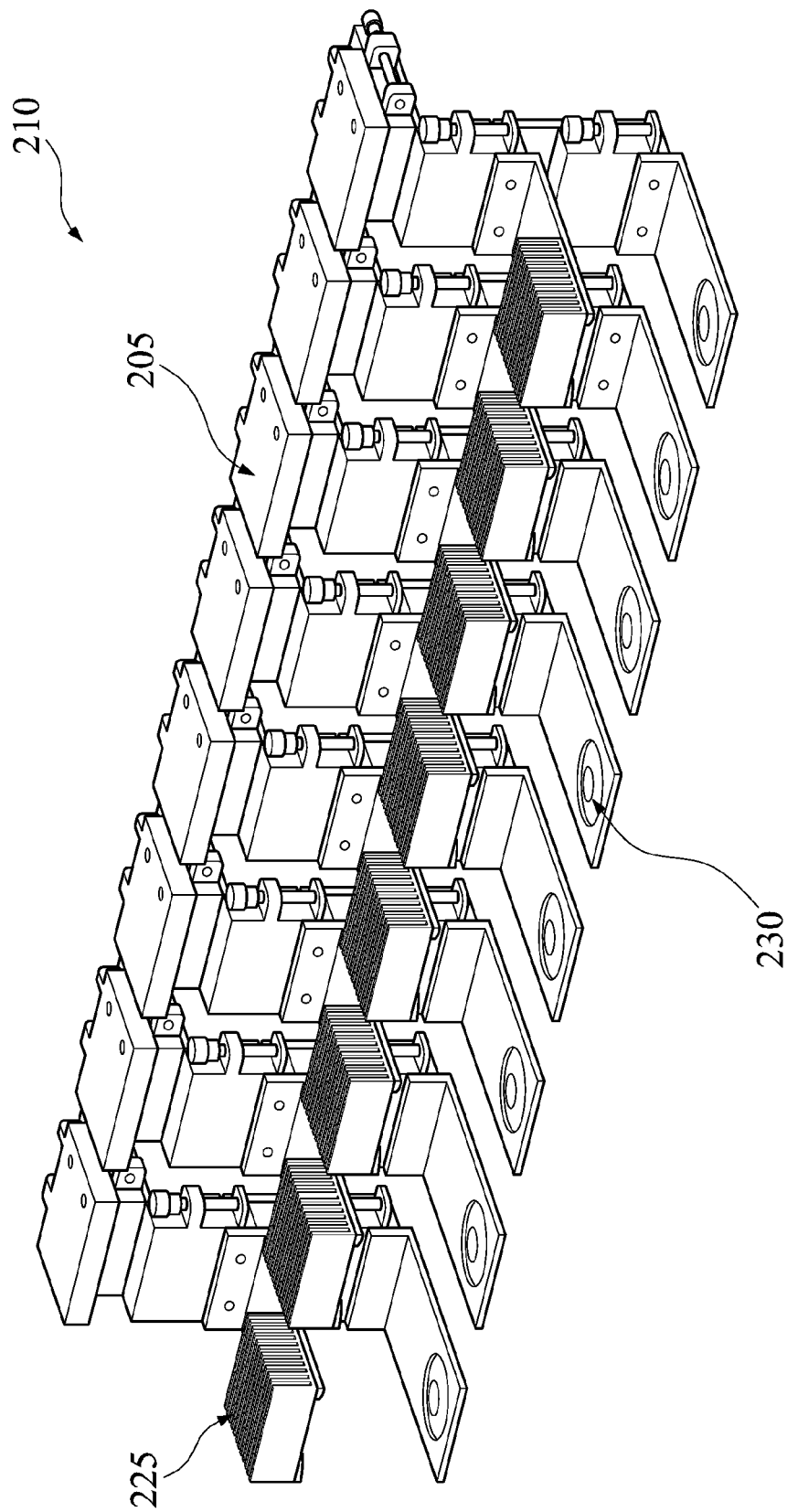
FIGS. 2A and 2B are schematic views illustrating an embodiment of a laser diode array structure of the invention.
Figure 2B:
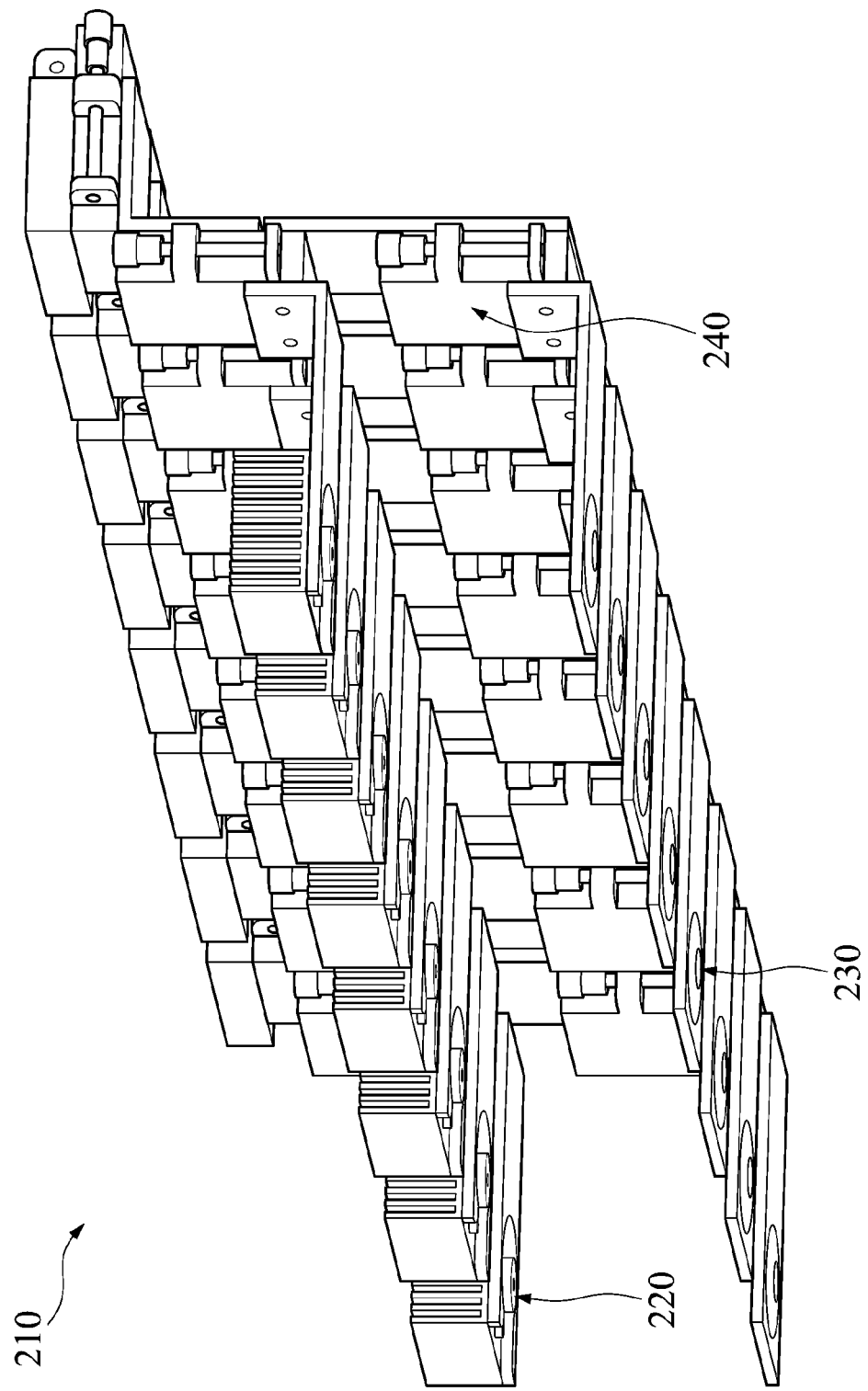

FIGS. 2A and 2B are schematic views illustrating an embodiment of a laser diode array structure. Referring to FIG. 2A, a laser diode array 210 can be a working module consisting of multiple independent laser diodes, such as a column of working modules with 8 staggered laser diodes. The wavelengths of each laser diode are located within a near IR band or visible light band. Laser diodes 220 (as shown in FIG. 2B) of the laser diode array working module is fixed to an X-Y-Z axis micro gauge platform 205. A heat dissipation structure 225 or a heat sink is fixed to the other side of the laser diode 220 to pump out excess heat. A focus lens 230 is fixed to a Z-axis lens platform 240. The X-Y-Z axis micro gauge platform 205 is an adjustment means to regulate pitches between each laser diode 220. In one embodiment, the distance between adjacent laser diodes is adjusted by the adjustment means. The entire laser diode array is rotated or tilted by the adjustment means. In additional, the Z-axis lens platform 240 is an additional adjustment means for adjusting or moving a relative distance between each lens and each laser diode. The additional adjustment means can also be used for moving the working piece (such as the first and the second material layers) or adjusting a relative distance between each lens and the first material layer. In other embodiments, the additional adjustment means is controlled by adjusting movement along the X, Y, and Z axes to regulate the relative distance between each lens and each laser diode such that each lens and each laser diode are aligned with the same axis and the same center.

Figure 3A:
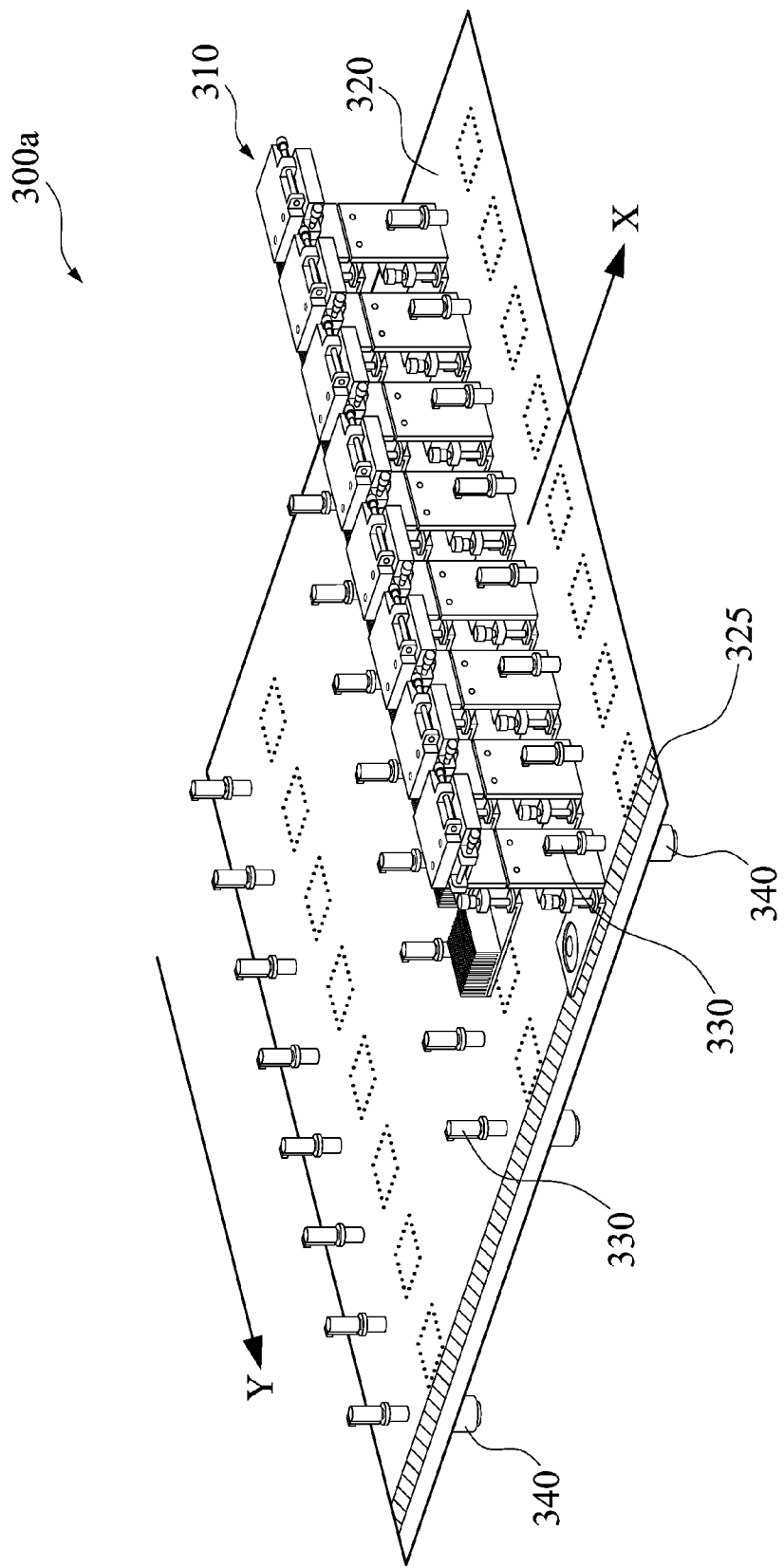
FIGS. 3A and 3B are schematic views illustrating another embodiment of an apparatus for fabricating micro patterns using a laser diode array of the invention.

FIG. 3A is a schematic view illustrating another embodiment of an apparatus for fabricating micro patterns using a laser diode array. In another embodiment, two additional functions are further added to the laser diode array apparatus for fabricating micro patterns. One function is for checking transparent variation of the phase retardation film, while the other is for synchronously fabricating the micro retardation (μ-retarder) film. Referring to FIG. 3A, an apparatus 300a for fabricating micro patterns using a laser diode array includes a laser diode array 310, and a working piece 320 located underneath the laser diode array 310. A laser diode measuring light source 330 and a detector 340 are respectively disposed on both top and bottom sides of the working piece 320 to analyze phase variation of the micro patterns 325 when processing the working piece 320. In this embodiment, the measuring light source 330 and detector 340 are arranged in an array form. For example, the measuring light source and detector can be arranged in three columns or even closer as shown in FIG. 3A. When fabricating the micro patterns, the laser diode measuring light source moves along the Y-axis direction, while the working piece 320 moves along the X-axis direction. In another embodiment, the measuring light source 330 and detector 340 can be arranged in a single column form integrated with the laser diode array 310 as shown as the laser diode array apparatus 300b for fabricating micro patterns in FIG. 3B. Note that the measuring light source 330 and detector 340 can compose at least one laser light analyzing system which is synchronously producing micro patterns and checking out the phase retardation variation of the micro patterns. Although some transmissive laser light analyzing systems (i.e., the measuring light source 330 and detector 340 are disposed on different sides of the working piece 320) are provided for implementing different features of various embodiments, these are merely examples and are not intended to be limiting. It should be understood that the measuring light source 330 and detector 340 can also disposed on the same side of the working piece 320.

Figure 4A:
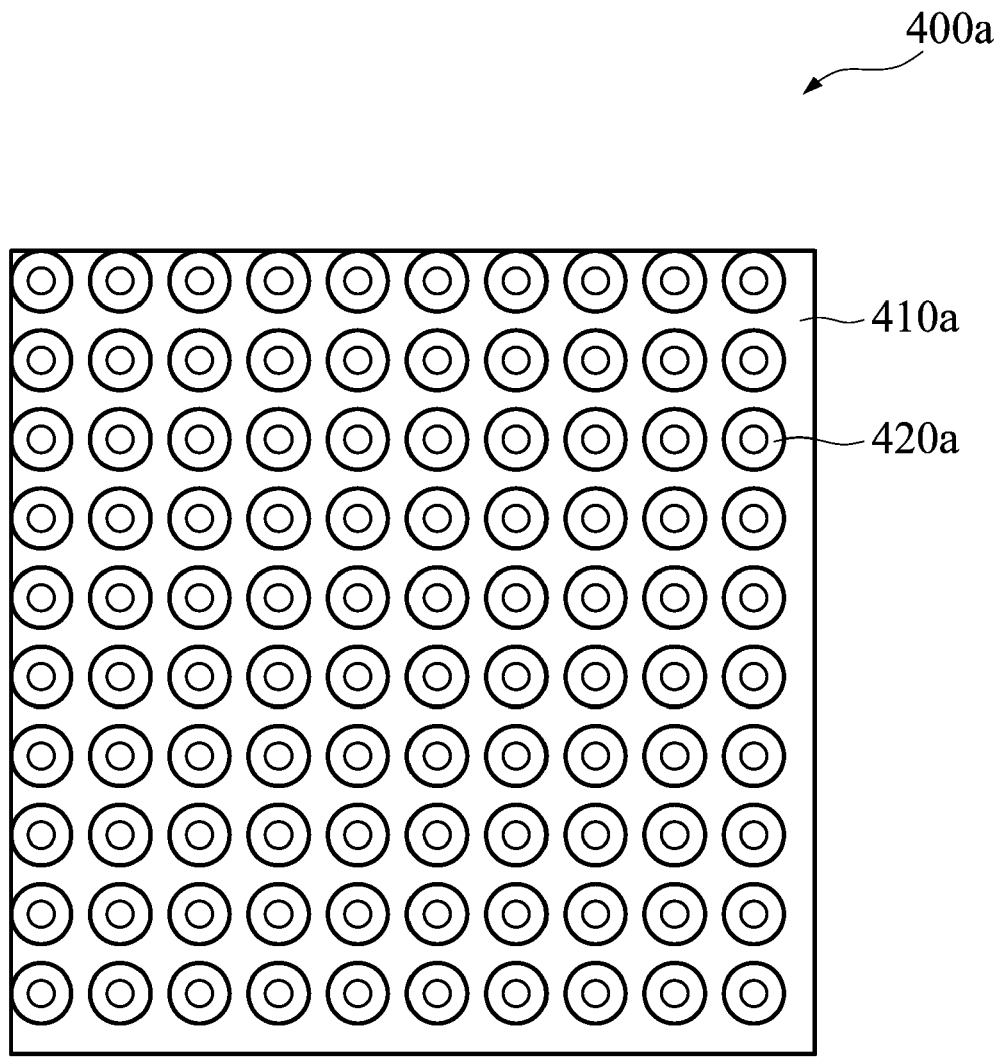
FIGS. 4A and 4B are schematic views illustrating an embodiment of the laser diode array structures of the invention.
Figure 4B:
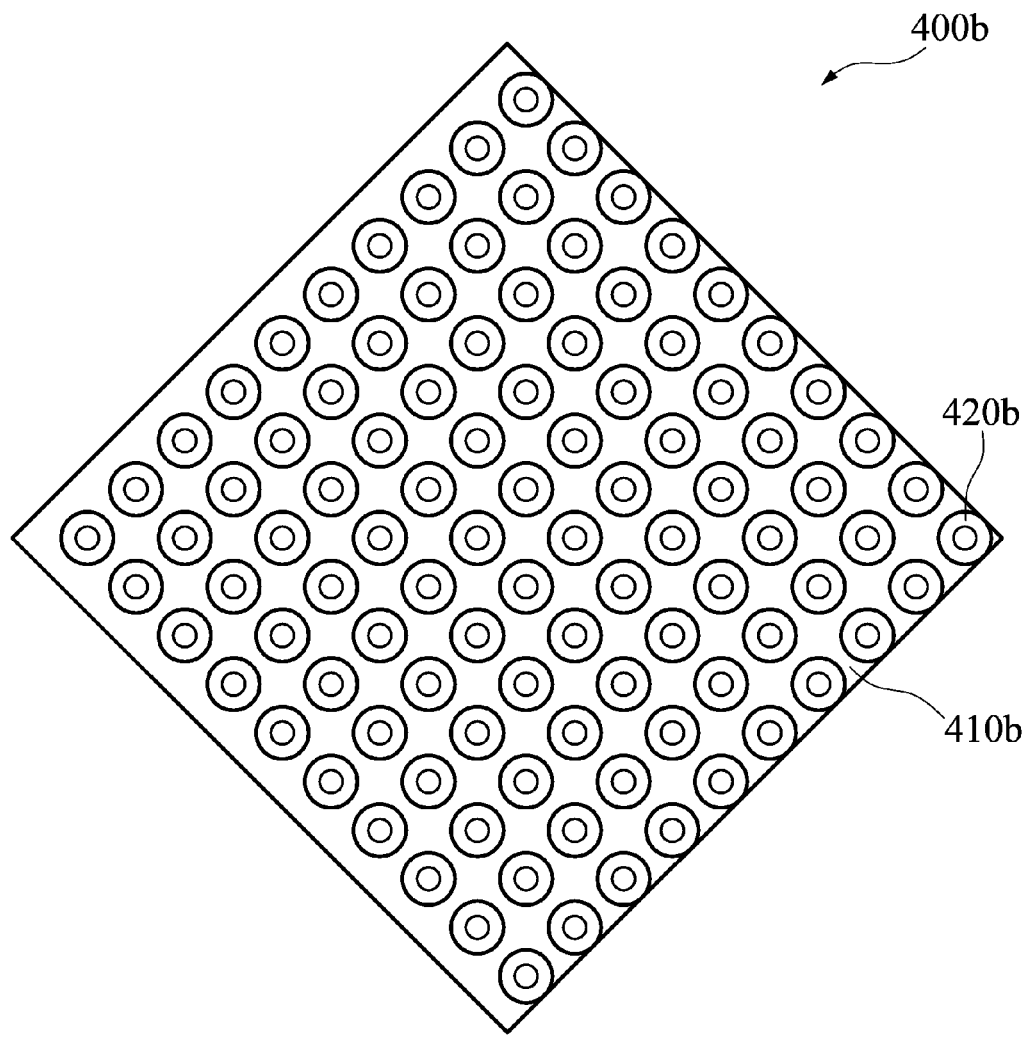

FIGS. 4A and 4B are schematic views illustrating an embodiment of the laser diode array structures. Referring to FIG. 4A, the laser diode array 400a can comprise a two-dimensional array (such as a square matrix or a rectangular matrix) consisting of multiple laser diodes 420a. The laser diode array 400a can be fixed to a frame 410a. Alternatively, referring to FIG. 4B, the laser diode array 400b can comprise a two-dimensional array (such as a rhombic square matrix or a rhombic rectangular matrix) consisting of multiple laser diodes 420b. In another embodiment, a rotation control means can be used to control rotated angles of the laser diode array 400a of FIG. 4A such that an interval between adjacent laser diode can be controlled.

Figure 5A:
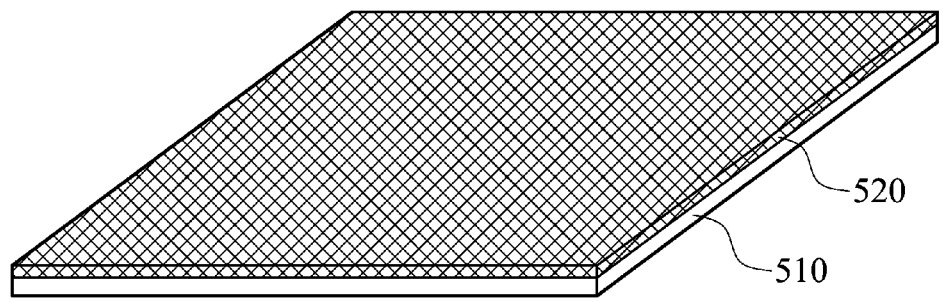
FIGS. 5A and 5B are schematic views illustrating an embodiment of the working pieces structures of the invention.
Figure 5B:
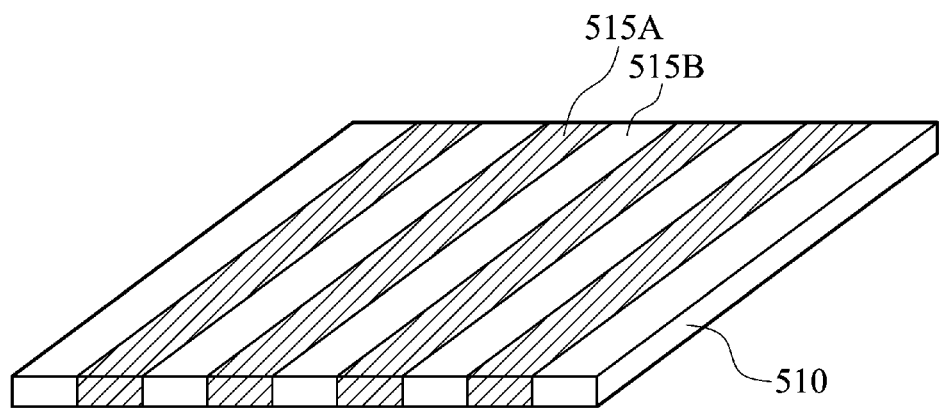

FIGS. 5A and 5B are schematic views illustrating an embodiment of the working pieces structures. The working pieces for processing micro patterns thereon using the laser diode array includes a second material layer 520 disposed on the first material layer 510. The first material layer 510 can be a film for processing micro patterns thereon. In another embodiment, the second material layer is a laser absorption layer such as a black colored PET film which can absorb laser light. The second material layer 520 is glued onto or electrostatically attached to the first material layer. Alternatively, the second material layer is a dye-containing layer directly formed on the first material layer. A laser diode provides enough power to generate infrared (IR) light which is directly irradiated on the second material layer 520 (such as a black colored protective film or a laser absorption layer) overlying the first material layer 510. Alternated micro patterns with different phase retardations 515A and 515B (as shown in FIG. 5B) can be periodically formed on the first material layer. Finally, the second material layer 520 is removed from the first material layer 510.

When fabricating the micro patterns using the laser diode array apparatus, each laser diode can be fixed to a mechanic robot for testing the laser diodes. The working pieces can be driven by the precision bearings motor to implement fabrication of micro patterns. Using the infrared (IR) light generated from laser diodes, the IR light is directly irradiated and focused on the black colored protective film (or a laser absorption layer) overlying the film to be patterned. Since the black colored protective film (or a laser absorption layer) possess characteristics of enduring high temperature, anti-reflection, and non-transmission, a light emitted from laser diodes can rapidly transform into heat energy, thereby forming micro patterns on the working pieces. Note that the apparatuses for fabricating micro patterns using a laser diode array can be incorporated with a precision bearings motor. The moving speed of the working pieces can be effectively controlled. A system for mass production and speedy fabrication of micro patterns is achieved by combination of the laser diode array apparatus and the precision bearings motor. Moreover, the laser diode array can be designed to scan line patterns with different pitches. In another embodiment, a black colored protective film (or a laser absorption layer which requires coating and removal) can be removed after implementation of the of laser diode processing process.

Figure 3B:
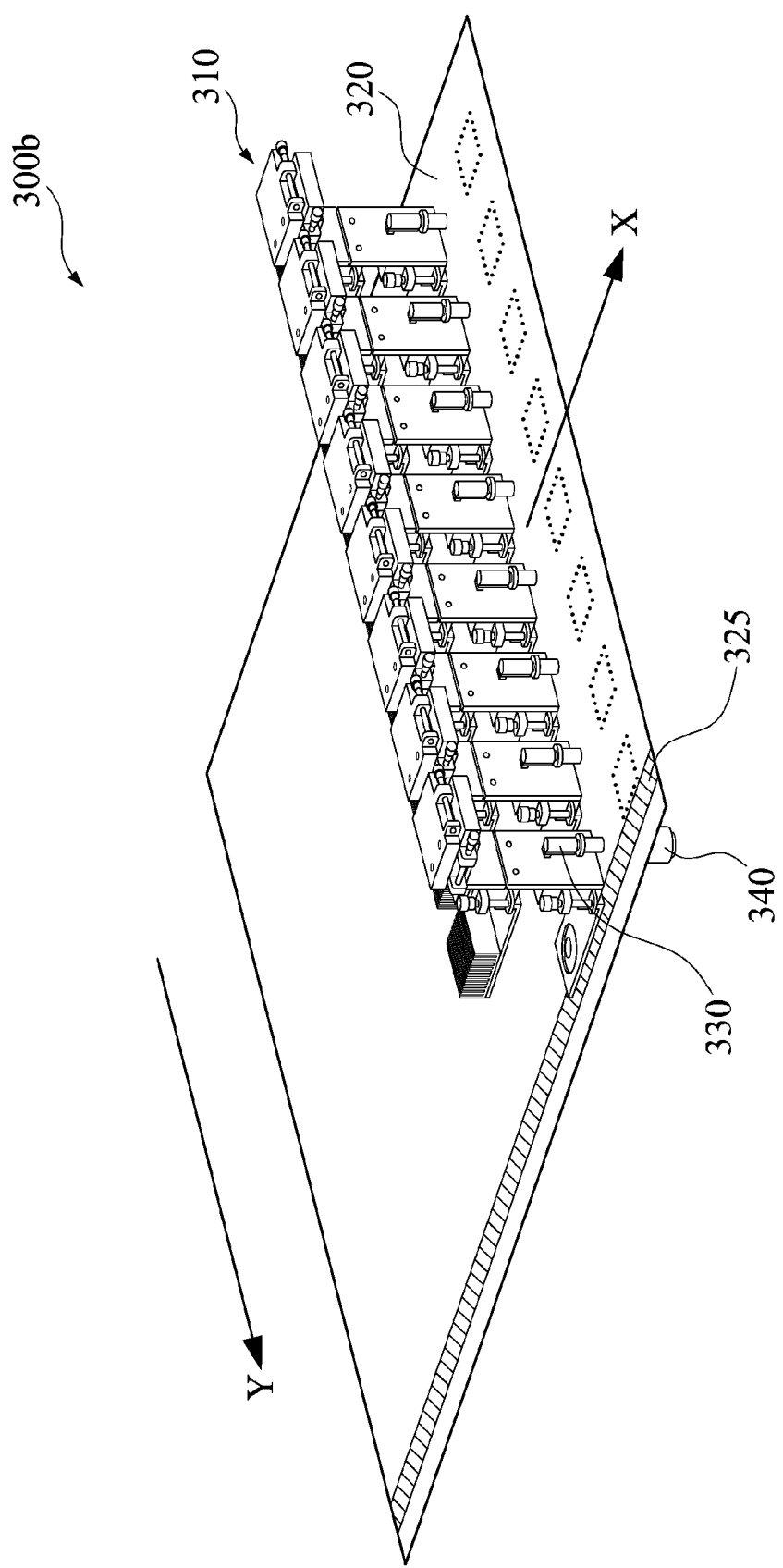

In another embodiment, since the laser diode array (as shown in FIGS. 3A and 3B) possesses light, small, and prone to rearrange characteristics, a material layer with micro patterns can be rapidly produced. The above characteristics are very important and critical to fabricate large-sized micro patterns. The infrared light emitted from the laser diodes can directly pass through the convex lens and then be focused on the black colored protective film (or a laser absorption layer) overlying the film to be patterned. Note that characteristics of enduring high temperature, anti-reflection, and non-transmission. The light emitted from laser diodes can therefore rapidly be transformed into heat energy. The black colored protective film adhered on the film to be patterned is originally used to prevent it from scratching or damage. Another function, is that when the film to be patterned absorbs infrared light and transforms it into heat (for example raising temperature over 65° C.), the generated heat is transferred from the black colored protective film (or a laser absorption layer) to the underlying film. Stripe patterns (such as with phase retardation variations) can thus be formed on the film to be patterned. Therefore, the black colored protective film not only serves as a protective film from scratching or damage but also serves as a medium for transforming light energy to heat. After completing fabrication of micro patterns using the laser diode array, the black colored protective film can be removed. In another embodiment, a laser absorption layer can be coated onto the film to be patterned. After laser processing, the laser absorption layer can be removed.

Further, in another embodiment, one principle aspect provides laser diodes (a laser diode array) set up to a testing robot of the laser diodes on the path of the patterned film (or the working pieces). The working pieces can be driven by a precision bearings motor to implement fabrication of micro patterns. By using the infrared (IR) light generated from laser diodes, the IR light is directly irradiated and focused on the black colored protective film (or a laser absorption layer) overlying the film to be patterned. Since the black colored protective film (or a laser absorption layer) possesses characteristics of enduring high temperature, anti-reflection, and non-transmission, the light emitted from laser diodes can rapidly transform into heat energy, thereby forming micro patterns on the working pieces.

Therefore, arrangements of the laser diode array can be designed to various forms (for example, adjustable pitches between laser diodes can be designed to scan stripe patterns with different pitches and line widths). Multiple tripe patterns can thus be formed in a single treatment. Black colored protective films (or laser absorption layers) are developed to transform light energy into thermal energy such that a phase retarded variation structure can be created on the underlying film. Compared with the conventional $CO_2$ laser, the laser diode array with relatively smaller volume emits light which can be rapidly transformed into heat energy (e.g., absorbed by the black colored protective films or laser absorption layers), thereby indirectly heating and forming micro patterns on the working pieces. After completing fabrication of micro patterns using a laser diode array, the black colored protective film can be removed. Alternatively, a laser absorption layer can be coated onto the film to be patterned. After laser processing, the laser absorption layer can be removed.

In another embodiment, the laser diode array (such as the apparatus for fabricating micro patterns as shown in FIG. 3A) is advantageous due to its small volume and low production cost. For example, maximum output power can reach 3 W and wavelength of the emitted light can be 808 nm. By incorporating the laser diode controller with electric current controlled within a range between 0±4 Amp, fabrication of micro patterns can thus be implemented. The conventional $CO_2$ laser fabrication problems due to large volume, high production cost, and slow throughput can be solved by adopting the laser diode array apparatus. Moreover, the pitch between adjacent laser diodes can be adjustable to fabricate stripe patterns with different pitches. Furthermore, the entire laser diode array is rotated or tilted (as shown in FIGS. 4A and 4B) for scanning with different line pitches. The apparatus for fabricating micro patterns using a laser diode array can be used to produce films with large scale micro patterns.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for fabricating micro patterns using a laser diode array, comprising:
   a laser diode array having at least two laser diodes,
   wherein light emitted from each laser diode is focused by a convex lens onto a second material layer attached to a first material layer; and
   an adjustment means for adjusting the gap and pitch between adjacent laser diodes.

2. The apparatus for fabricating micro patterns as claimed in claim 1, wherein the second material layer is glued onto or electrostatically attached to the first material layer.

3. The apparatus for fabricating micro patterns as claimed in claim 1, wherein the second material layer is a laser absorption layer.

4. The apparatus for fabricating micro patterns as claimed in claim 1, wherein the second material layer is a black colored laser absorption layer.

5. The apparatus for fabricating micro patterns as claimed in claim 1, wherein the second material layer is a dye-containing layer directly formed on the first material layer.

6. The apparatus for fabricating micro patterns as claimed in claim 1, wherein the first material layer is a film on which a micro pattern is desirably formed.

7. The apparatus for fabricating micro patterns as claimed in claim 1, wherein the first material layer is a phase retardation film.

8. The apparatus for fabricating micro patterns as claimed in claim 1, wherein the wavelengths of each laser diode are located within a near IR band or visible light band.

9. An apparatus for fabricating micro patterns using a laser diode array, comprising:
   a laser diode array having at least two laser diodes, wherein light emitted from each laser diode is focused by a convex lens onto a second material layer attached to a first material layer;
   at least one driving shaft driving relative motion of the first and the second material layers; and
   an adjustment means for adjusting the gap and pitch between adjacent laser diodes.

10. The apparatus for fabricating micro patterns as claimed in claim 9, wherein the driving shaft is used for adjusting the relative moving speed between the first and the second material layers.

11. The apparatus for fabricating micro patterns as claimed in claim 9, further comprising an additional adjustment means for adjusting or moving a relative distance between each lens and each laser diode.

12. The apparatus for fabricating micro patterns as claimed in claim 11, wherein the additional adjustment means is controlled by adjusting movement along the X, Y, and Z axes to regulate the relative distance between each lens and each laser diode.

13. The apparatus for fabricating micro patterns as claimed in claim 9, further comprising an additional adjustment means for adjusting or moving a relative distance between each lens and the first material layer.

14. The apparatus for fabricating micro patterns as claimed in claim 9, wherein each lens and each laser diode are aligned with the same axis and the same center.

15. The apparatus for fabricating micro patterns as claimed in claim 9, wherein a distance between adjacent laser diodes is adjusted by the adjustment means.

16. The apparatus for fabricating micro patterns as claimed in claim 9, wherein the entire laser diode array is rotated or tilted by the adjustment means.

17. The apparatus for fabricating micro patterns as claimed in claim 9, further comprising at least one laser light analyzing system, synchronously producing micropatterns and checking out phase retardation variation of the micro patterns.

18. A method for fabricating micro patterns, comprising:
  providing a laser diode array fabrication apparatus, wherein the laser diode array has at least two laser diodes and an adjustment means for adjusting the gap and pitch between adjacent laser diodes; and
  focusing a light emitted from each laser diode through a lens onto a second material layer which is disposed on the first material layer to create micro patterns on the first material layer.

19. The method for fabricating micro patterns as claimed in claim 18, wherein the second material layer is glued onto or electrostatically attached to the first material layer.

20. The method for fabricating micro patterns as claimed in claim 18, wherein the second material layer is a laser absorption layer.

21. The method for fabricating micro patterns as claimed in claim 18, wherein the second material layer is a black colored laser absorption layer.

22. The method for fabricating micro patterns as claimed in claim 18, wherein the second material layer is a dye-containing layer directly formed on the first material layer.

23. The method for fabricating micro patterns as claimed in claim 18, wherein the first material layer is a film on which a micro pattern is desirably formed.

24. The method for fabricating micro patterns as claimed in claim 18, wherein the first material layer is a phase retardation film.

25. The method for fabricating micro patterns as claimed in claim 18, wherein the wavelengths of each laser diode are located within a near IR band or visible light band.

\* \* \* \* \*